(12) United States Patent
Nakamura

(10) Patent No.: US 10,622,738 B2
(45) Date of Patent: Apr. 14, 2020

(54) CONNECTOR

(71) Applicant: Japan Aviation Electronics Industry, Limited, Tokyo (JP)

(72) Inventor: Tomohiro Nakamura, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 16/435,746

(22) Filed: Jun. 10, 2019

(65) Prior Publication Data

US 2020/0006875 A1 Jan. 2, 2020

(30) Foreign Application Priority Data

Jun. 28, 2018 (JP) .................................. 2018-123026

(51) Int. Cl.
*H01R 12/83* (2011.01)
*H01R 12/72* (2011.01)
*H01R 13/70* (2006.01)
*H01R 24/50* (2011.01)
*H01R 13/502* (2006.01)
(Continued)

(52) U.S. Cl.
CPC ........... *H01R 12/72* (2013.01); *G06K 7/0056* (2013.01); *G06K 7/0082* (2013.01); *H01R 12/83* (2013.01); *H01R 12/85* (2013.01); *H01R 13/193* (2013.01); *H01R 13/24* (2013.01); *H01R 13/502* (2013.01); *H01R 13/6593* (2013.01); *H01R 13/6594* (2013.01); *H01R 13/701* (2013.01);
(Continued)

(58) Field of Classification Search
CPC .............. H01R 13/629; H01R 13/6275; H01R 12/721; H01R 12/7005; H05K 5/0286; G06K 7/0082; G06K 7/0056; G06K 7/0021

See application file for complete search history.

(56) References Cited

U.S. PATENT DOCUMENTS 6,062,889 A * 5/2000 Hyland ................ G06K 7/0021
200/51.12
6,106,317 A * 8/2000 Michaelis .......... G06K 13/0862
235/486

(Continued)

FOREIGN PATENT DOCUMENTS

JP 2002-198110 A 7/2002
JP 2003-086302 A 3/2003
(Continued)

*Primary Examiner* — Felix O Figueroa
(74) *Attorney, Agent, or Firm* — Collard & Roe, P.C.

(57) ABSTRACT

A cover of a connector has axis portions and first and second cover contact points. A housing has axis receiving portions and first through third contact portions. The axis portions are received by the axis receiving portions, and the cover is attached to the housing to be placed at any one of an open position, a closed position and a locked position. The first contact portions are exposed in the axis receiving portions. When the cover is placed at the locked position, the axis portions are face the first contact portions from beneath, and the second cover contact points are face the second contact portions from beneath. When the cover is placed at the closed position, the first cover contact points do not touch the third contact portions. When the cover is placed at the locked position, the first cover contact points touch the third contact portions.

7 Claims, 12 Drawing Sheets

(51) Int. Cl.
*H05K 5/02* (2006.01)
*H01R 13/24* (2006.01)
*H05K 7/14* (2006.01)
*H01R 13/6594* (2011.01)
*H01R 12/85* (2011.01)
*H01R 13/6593* (2011.01)
*H01R 13/193* (2006.01)
*G06K 7/00* (2006.01)

(52) U.S. Cl.
CPC ............ *H01R 24/50* (2013.01); *H05K 5/0286* (2013.01); *H05K 7/1427* (2013.01)

(56) References Cited

U.S. PATENT DOCUMENTS

| | | | | |
|---|---|---|---|---|
| 6,149,466 | A * | 11/2000 | Bricaud | G06K 7/0021 235/441 |
| 6,383,027 | B2 * | 5/2002 | Cabane | G06K 7/0021 439/260 |
| 6,394,817 | B1 | 5/2002 | Kihira et al. | |
| 6,761,573 | B1 * | 7/2004 | Chiu | H01R 12/79 439/260 |
| 6,761,575 | B2 * | 7/2004 | Bricaud | G06K 7/0021 439/326 |
| 6,951,472 | B2 * | 10/2005 | Shih | G06K 19/07732 439/138 |
| 7,066,766 | B2 * | 6/2006 | Harasawa | G06K 7/0021 439/630 |
| 7,140,899 | B2 | 11/2006 | Matsunaga | |
| 7,976,327 | B2 * | 7/2011 | Matsumoto | G06K 13/0862 439/326 |
| 8,113,861 | B2 * | 2/2012 | Shen | H01R 12/83 439/326 |
| 8,123,541 | B2 * | 2/2012 | Hsu | H01R 12/716 439/325 |
| 8,545,250 | B2 * | 10/2013 | Ju | H01R 12/85 439/265 |
| 9,122,970 | B2 * | 9/2015 | Huang | H01R 12/716 |

FOREIGN PATENT DOCUMENTS

| | | |
|---|---|---|
| JP | 2006-100157 A | 4/2006 |
| JP | 2006-156107 A | 6/2006 |
| JP | 2007-026918 A | 2/2007 |
| JP | 2012-018930 A | 1/2012 |

* cited by examiner

CONNECTOR

CROSS REFERENCE TO RELATED APPLICATIONS

This application is based on and claims priority under 35 U.S.C. § 119 to Japanese Patent Application No. JP2018-123026 filed Jun. 28, 2018, the contents of which are incorporated herein in their entirety by reference.

BACKGROUND OF THE INVENTION

This invention relates to a connector, in particular, to a connector for a card-type device.

JPA2002-198110 (Patent Document 1) discloses a connector having a structure which conducts heat generated in a card-type device accommodated in the connector to a substrate on which the connector is mounted. As shown in FIG. 16, the connector 90 of Patent Document 1 is provided with a connector body (housing) 91 and a cover member (cover) 92. The connector body 91 is mounted on a substrate (not shown) when the connector 90 is used. The cover member 92 is attached to the connector body 91 to be openable and closable. The connector body 91 is provided with a heat transfer member 911. The heat transfer member 911 is connected to the substrate on which the connector 90 is mounted. The cover member 92 is formed with a thermal conduction tongue piece 921 and a hanging portion 923. The thermal conduction tongue piece 921 has resilience. When the cover member 92 is closed, the thermal conduction tongue piece 921 is brought into contact with a card-type device (not shown), and the hanging portion 923 is pressed against the heat transfer member 911. As a result, heat generated in the card-type device is conducted to the substrate via the thermal conduction tongue piece 921 of the cover member 92, the hanging portion 923 of the cover member 92 and the heat transfer member 911 of the connector body 91.

On the other hand, JPA2003-86302 (Patent Document 2) discloses another connector having a structure which maintains a locked state by sliding a cover in a front-rear direction after closing the cover. As shown in FIG. 17, the connector 95 of Patent Document 2 is provided with a housing 96 and a cover 97. The cover 97 is attached to the housing 96 by means of axial protrusions 971. The cover 97 can be shifted between an open state (shown in (a) of FIG. 17) and a closed state (shown in (b) of FIG. 17) using the axial protrusions 971 as a pivotal axis. When the cover 97 under the closed state (shown in (b) of FIG. 17) is moved forward, the cover 97 is shifted into a locked state (shown in (d) of FIG. 17) through a transition state (show in (c) of FIG. 17). In the locked state (shown in (d) of FIG. 17), a front-end portion 973 of the cover 97 is engaged with an engaging portion 961 of the housing 96, and thereby preventing the cover 97 from being shifted from the locked state (shown in (d) of FIG. 17) to the open state (shown in (a) of FIG. 17) directly.

SUMMARY OF THE INVENTION

In a connector for a card-type device, it is better that the number of contact portions between a cover of the connector and a housing of the connector is larger in order to efficiently conduct heat generated in the card-type device to a substrate on which the connector is mounted. Meanwhile, there is a request to keep away from a situation that the contact portions between the cover and the housing interfere with an opening-closing operation of the cover.

It is therefore an object of the present invention to provide a connector which is provided with a thermal dissipation structure capable of forming a thermal conduction path from a cover to a housing without obstructing an opening-closing operation of a cover.

The present invention provides a connector that even uses parts, with which an existing connector is also provided, to conduct heat and is further provided with a new thermal dissipation structure. The new thermal dissipation structure is formed so that contact portions provided for a housing are not brought into contact with a cover during an opening-closing operation of the cover but brought into contact with the cover upon shifting the cover from a closed state into a locked state.

One aspect of the present invention provides a connector which is mountable on a substrate. The connector comprises a cover, a housing and a plurality of contact rows. The housing has an accommodation portion which accommodates a card having a plurality of card contact points. The housing is provided with two axis receiving portions and two lock portions. The lock portions are located forward of the axis receiving portions in a front-rear direction. The axis receiving portions are located apart from each other in a lateral direction perpendicular to the front-rear direction. The lock portions are located apart from each other in the lateral direction. The housing comprises an insulation portion and a frame. The insulation portion holds the contact rows. The insulation portion further holds the frame while the frame is exposed in part. The frame comprises a single-piece member made of metal and has a plurality of fixed portions, two first contact portions, two second contact portions, a plurality of third contact portions and a plurality of support spring portions. The first contact portions correspond to the axis receiving portions, respectively. Each of the first contact portions is exposed in the axis receiving portion corresponding thereto. The second contact portions correspond to the lock portions, respectively. The support spring portions have resilience and are located between the first contact portions and the second contact portions in the front-rear direction. The third contact portions are supported by the support spring portions, respectively. The third contact portions are movable at least in a direction perpendicular to the front-rear direction by using the resilience of the support spring portions. The fixed portions are fixed to the substrate when the connector is mounted on the substrate. At least one of the fixed portions is arranged between the first contact portions and the third contact portions in the front-rear direction. At least another one of the fixed portions is arranged between the second contact portions and the third contact portions in the front-rear direction. Each of the contact rows is formed of a plurality of contacts which are arranged in the lateral direction. Each of the contacts has a contact point and a supporting portion. The contact point is located in the accommodation portion. The supporting portion has resilience and supports the contact point. By using the resilience of the supporting portion, the contact point is movable at least in an up-down direction perpendicular to both of the front-rear direction and the lateral direction. When the card is accommodated in the accommodation portion, the contact point is pressed downward in the up-down direction by one of the card contact points and receives an upward force given by a reaction force of the supporting portion. The cover is made of metal and has a main portion, two axis portions, two first cover contact points, two locked portions and two second cover contact points. The axis portions are located outward of the main portion in the lateral direction. The axis portions are received by the axis receiving portions, respectively, so that the cover is attached to the housing so as to be positioned at any one of an open position, a closed position and a locked position. The cover is pivotally movable between the open position and the closed position about the axis portions used as a pivotal axis. The cover is movable between the closed position and the locked position in the front-rear direction. When the cover is in the locked position, the main portion of the cover is positioned on or above an upper part of the housing and covers the accommodation portion. When the cover is in the locked position, the axis portions are positioned downward of the first contact portions and face the first contact portions in the up-down direction, respectively. The locked portions are positioned outward of the main portion in the lateral direction. When the cover is placed at the locked position, the locked portions are positioned forward of the axis portions in the front-rear direction. The second cover contact points are positioned outward of the main portion in the lateral direction. When the cover is placed at the locked position, the second cover contact points are positioned downward of the second contact portions and face the second contact portions in the up-down direction, respectively. When the cover is placed at the closed position, the first cover contact points are not brought into contact with the third contact portions. When the cover is placed at the locked position, the first cover contact points are brought into contact with the third contact portions, respectively.

In the connector of the present invention, the frame of the housing has the first contact portions, the second contact portions and the third contact portions. The second contact portions and the third contact portions are not brought into contact with the cover during an opening-closing operation of the cover, but brought into contact with the cover upon shifting the cover from the closed position to the locked position. With this structure, thermal conduction paths from the cover to the housing can be formed without interfering with the opening-closing operation of the cover.

Moreover, in the connector of the present invention, since the frame is formed of the single-piece member, heat conducted from the cover to the frame is diffused all over the frame. Therefore, even if any one of the first to the third contact portions has a contact failure, thermal conduction from the frame to the substrate can be carried out with little effect of the contact failure.

An appreciation of the objectives of the present invention and a more complete understanding of its structure may be had by studying the following description of the preferred embodiment and by referring to the accompanying drawings.

Figure 1:
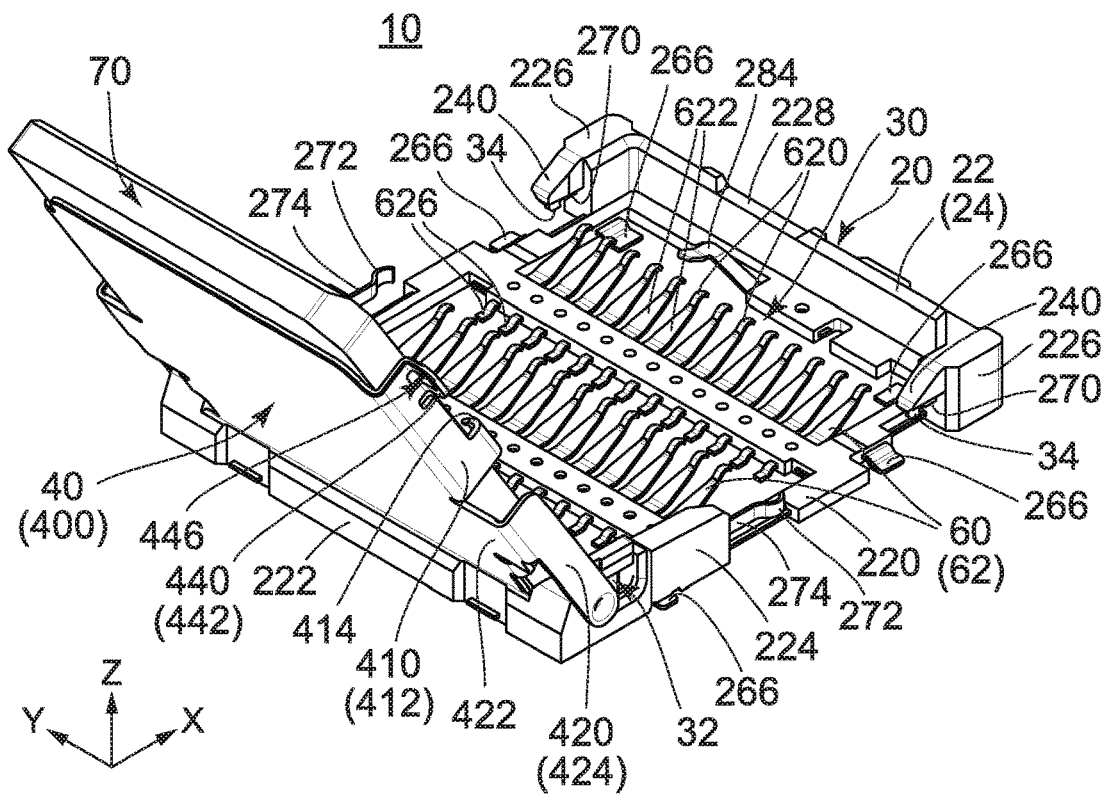
FIG. 1 is a first perspective view showing a connector according to an embodiment of the present invention along with a card-type device. A cover of the connector is placed at an open position. The card-type device is held by the cover.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

Referring to FIG. 1, a connector 10 according to an embodiment of the present invention is a connector which is used to be connected to a card-type device (hereinafter simply referred to as a card) 70. The connector 10 is mounted on a substrate (not shown) when used. The card 70 has a pair of principal surfaces each having an approximately rectangular shape and is also provided with a plurality of card contact points (not shown) on one of the principal surfaces. The card 70 is a memory card, for example. However, the present invention is not limited thereto. The present invention is applicable to another connector which is used to be connected to the card 70 other than the memory card.

As shown in FIG. 1, the connector 10 is provided with a connector body 20 and a cover 40. The connector body 20 is provided with a housing 22 and a plurality of contact rows 60. The cover 40 is attached to the housing 22 to be movable with respect to the housing 22. The cover 40 holds the card 70 movably when the connector 10 is used. The contact rows 60 are held by the housing 22.

Figure 2:
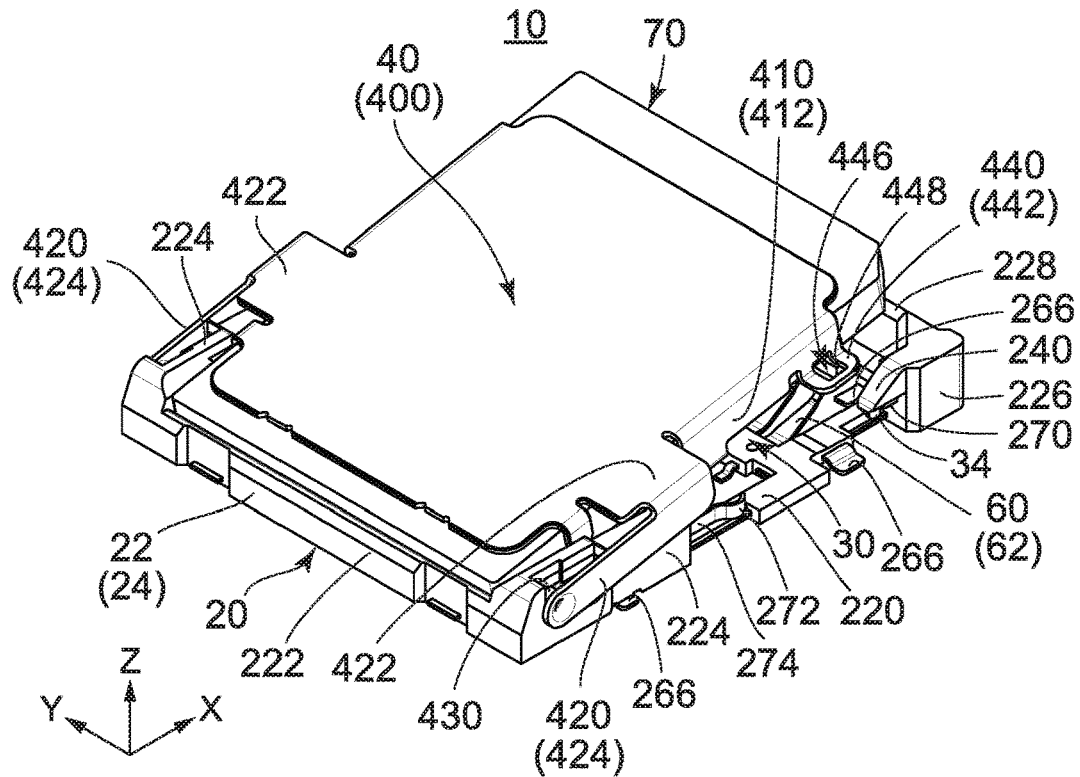
FIG. 2 is a second perspective view showing the connector of FIG. 1 along with the card-type device. The cover is positioned between the open position and a closed position. The card-type device is accommodated in an accommodation portion of a housing of the connector in part.
Figure 3:
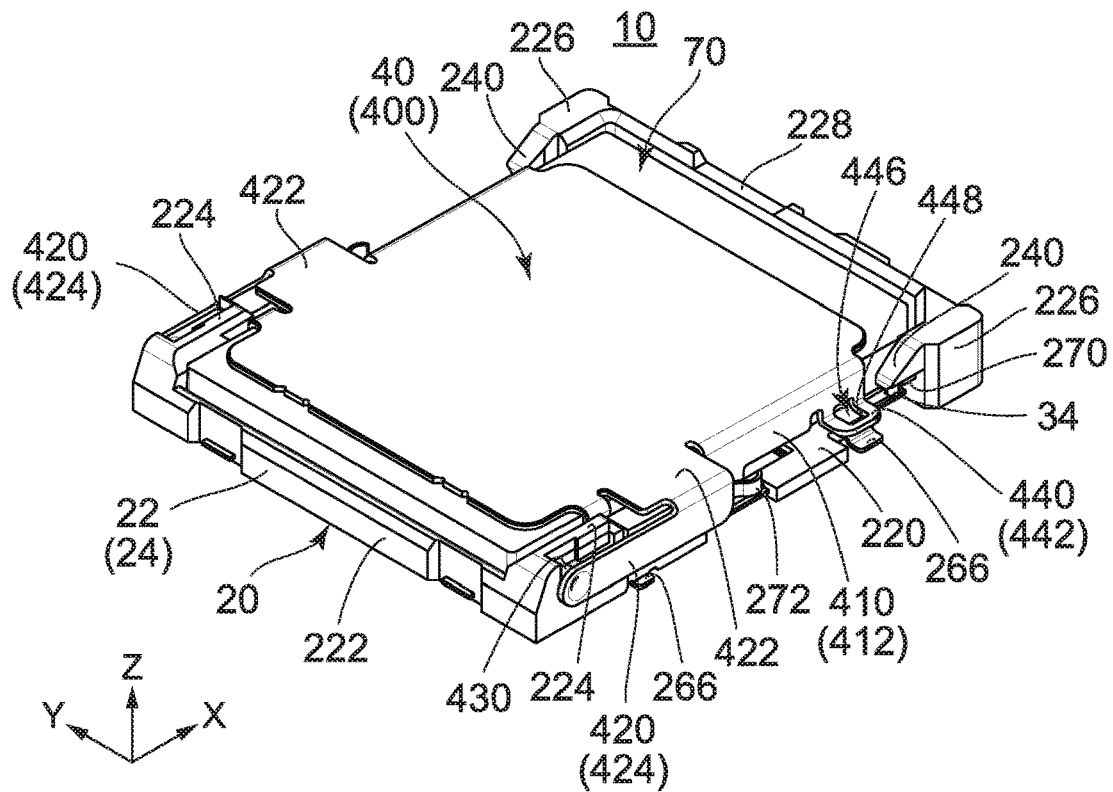
FIG. 3 is a third perspective view showing the connector of FIG. 1 along with the card-type device. The cover is placed at the closed position. The card-type device is accommodated in the accommodation portion of the housing.

As understood from FIGS. 1 to 3, the cover 40 is openable and closable with respect to the housing 22. In other words, the cover 40 is pivotable on a pivotal axis between an open position (see FIG. 1) and a closed position (see FIG. 3). Furthermore, as understood from FIGS. 3 and 4, the cover 40 is movable between the closed position and a locked position (see FIG. 4) in a front-rear direction. In addition, the cover 40 is pivotable on the pivotal axis within at least a necessary range for a locking and unlocking operation while it is moved between the closed position and the locked position. In the present embodiment, the front-rear direction is an X-direction. A positive X-direction is directed forward while a negative X-direction is directed rearward.

Figure 4:
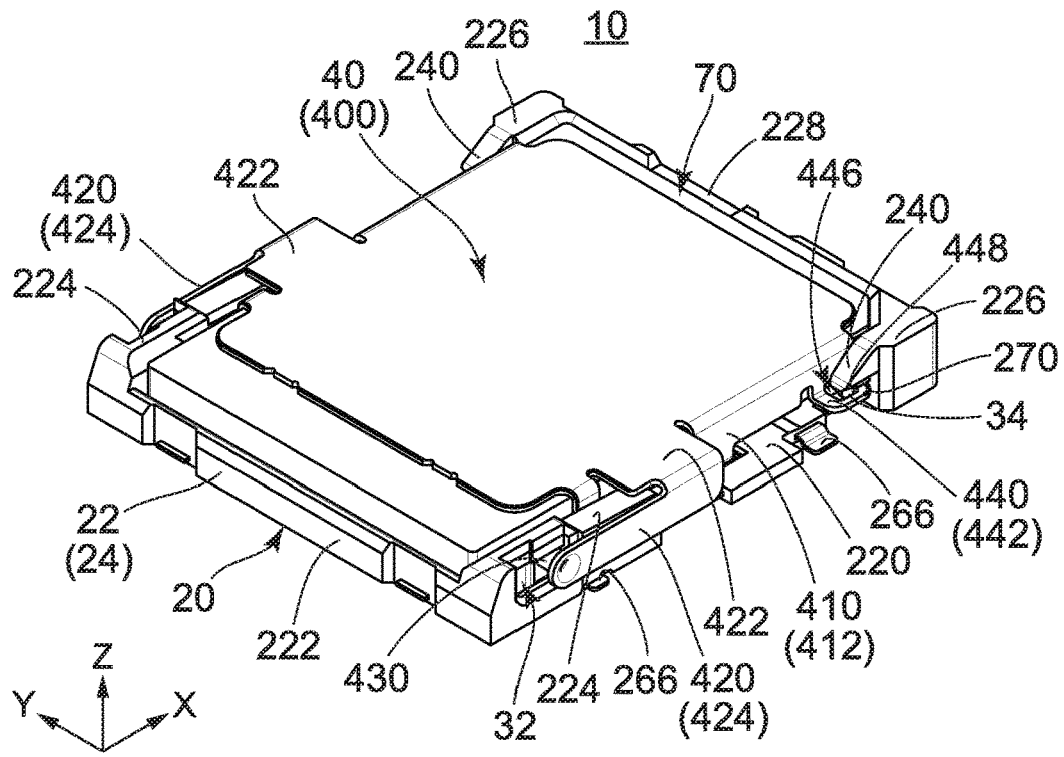
FIG. 4 is a fourth perspective view showing the connector of FIG. 1 along with the card-type device. The cover is placed at a locked position. The card-type device is accommodated in the accommodation portion of the housing.
Figure 5:
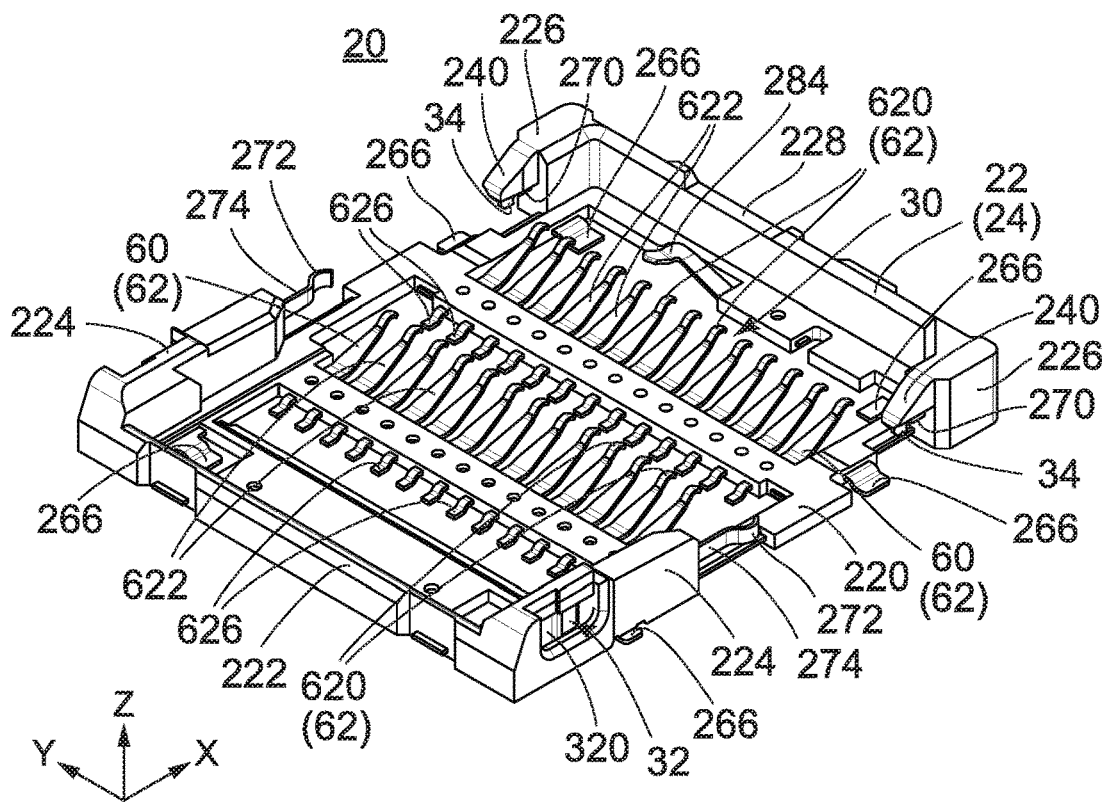
FIG. 5 is a perspective view showing a connector body included in the connector of FIG. 1.

Referring to FIG. 5, the housing 22 of the connector body 20 has a base 220, a rear wall 222, two rear sidewalls 224, two front sidewalls 226 and a front wall 228. The base 220 is formed in a lattice shape. The rear wall 222 is located on a rear edge of the base 220 in the front-rear direction. The rear sidewalls 224 are located forward of the rear wall 222 in the front-rear direction. The rear sidewalls 224 are located on both side portions of the base 220 in a lateral direction perpendicular to the front-rear direction. The rear sidewalls 224 are connected to both ends in the lateral direction of the rear wall 222, respectively. In the present embodiment, the lateral direction is a Y-direction. The front sidewalls 226 are located forward of and apart from the rear sidewalls 224 in the front-rear direction. The front sidewalls 226 are located on the both side portions of the base 220 in the lateral direction. The front wall 228 is located on a front edge of the base 220 in the front-rear direction. The front wall 228 has both ends in the lateral direction that are connected to the front sidewalls 226, respectively. The rear wall 222, the rear sidewalls 224, the front sidewalls 226 and the front wall 228 extend upward from the base 220 in an up-down direction perpendicular to both of the front-rear direction and the lateral direction. In the present embodiment, the up-down direction is a Z-direction. A positive Z-direction is directed upward while a negative Z-direction is directed downward. The base 220, the rear wall 222, the rear sidewalls 224, the front sidewalls 226 and the front wall 228 define an accommodation portion 30 which accommodates the card 70 (see FIG. 4). In other words, the housing 22 has the accommodation portion 30.

As understood from FIG. 5, the housing 22 is provided with two axis receiving portions 32. In detail, the axis receiving portions 32 are provided for the rear sidewalls 224 of the housing 22, respectively. The axis receiving portions 32 are located apart from each other in the lateral direction and open outward in the lateral direction. The axis receiving portions 32 are used to attach the cover 40 (see FIG. 4) to the housing 22.

As shown in FIG. 5, the housing 22 has two overhang portions 240 overhanging rearward from the front sidewalls 226, respectively, in the front-rear direction. The overhang portions 240 are provided with lock portions 34, respectively, protruding downward in the up-down direction. Thus, the housing 22 is provided with two of the lock portions 34. The lock portions 34 are located forward of the axis receiving portions 32 in the front-rear direction. Moreover, the lock portions 34 are located apart from each other in the lateral direction. The lock portions 34 are used to maintain the cover 40 (see FIG. 4) in a locked state.

Figure 6:
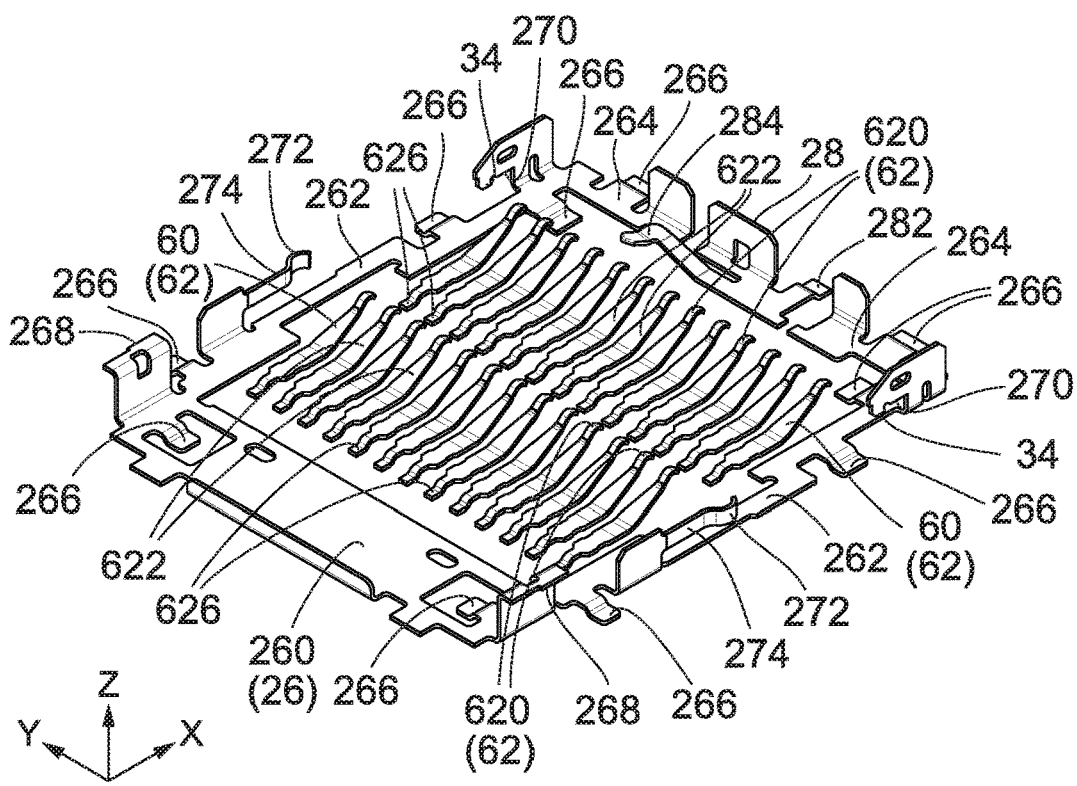
FIG. 6 is a perspective view showing the connector body of FIG. 5. An insulation portion of the connector body is removed.

As understood from FIGS. 5 and 6, the housing 22 is provided with an insulation portion 24, a frame 26 and an additional frame 28. The insulation portion 24 is made of insulation resin. Each of the frame 26 and the additional frame 28 is made of metal. The insulation portion 24 holds the frame 26, the additional frame 28 and the contact rows 60. In detail, the insulation portion 24 is integrally molded with the frame 26, the additional frame 28 and contacts 62 by using insulation resin.

As understood from FIGS. 5 and 6, each of the frame 26 and the additional frame 28 is exposed from the insulation portion 24 in part. In other words, the insulation portion 24 holds the frame 26 and the additional frame 28 in a state that each of the frame 26 and the additional frame 28 is exposed in part. In the present embodiment, the accommodation portion 30 of the housing 22 is defined by the insulation portion 24. The axis receiving portions 32 are defined by the insulation portion 24 and the frame 26. The lock portions 34 are parts of the frame 26.

As understood from FIG. 6, the frame 26 is a single-piece member made of metal. The frame 26 has a basal portion 260, two long edge portions 262 and two extending portions 264. The basal portion 260 extends in the lateral direction. The long edge portions 262 extend forward in the front-rear direction from both end portions in the lateral direction of the basal portion 260. The extending portions 264 extend inward in the lateral direction from front end portions of the long edge portions 262. The basal portion 260 corresponds to the rear wall 222. The long edge portions 262 correspond to the rear sidewalls 224, respectively, and the front sidewalls 226, respectively. The extending portions 264 correspond to the front wall 228. When viewed along the up-down direction perpendicular to both of the front-rear direction and the lateral direction, the frame 26 forms at least three sides of the accommodation portion 30 of the housing 22. In other words, the frame 26 surrounds the accommodation portion 30 but is not closed when viewed along the up-down direction. However, the present invention is not limited thereto. The frame 26 may completely surround the accommodation portion 30 when viewed along the up-down direction.

As shown in FIG. 6, the frame 26 has two first contact portions 268, two second contact portions 270, a plurality of third contact portions 272 and a plurality of support spring portions 274. In the present embodiment, the third contact portions 272 are two in number. The support spring portions 274 correspond to the third contact portions 272, respectively. In detail, the support spring portions 274 have resilience, and each of the support spring portions 274 supports the third contact portion 272 corresponding thereto. In the present embodiment, the support spring portions 274 are also two in number, accordingly. However, the present invention is not limited thereto. The number of the third contact portions 272 or the number of the support spring portions 274 may be three or more.

As understood from FIGS. 5 and 6, the first contact portions 268 correspond to the axis receiving portions 32, respectively. Each of the first contact portions 268 is exposed in the axis receiving portion 32 corresponding thereto at least in part.

As understood from FIG. 6, the second contact portions 270 correspond to the lock portions 34, respectively. Each of the second contact portions 270 is located forward of the lock portion 34 corresponding thereto in the front-rear direction. As shown in FIG. 5, the second contact portions 270 are also provided for the overhang portions 240. Similarly to the lock portions 34, the second contact portions 270 protrude downward from the overhang portions 240 in the up-down direction. However, lower ends of the second contact portions 270 are located upward of lower ends of the lock portions 34 in the up-down direction.

As shown in FIG. 6, the third contact portions 272 and the support spring portions 274 are located between the first contact portions 268 and the second contact portions 270 in the front-rear direction. Furthermore, the support spring portions 274 extend forward. Each of the third contact portions 272 is movable at least in a direction perpendicular to the front-rear direction by using the resilience of the support spring portion 274. In the present embodiment, the third contact portions 272 are movable at least in the lateral direction. However, the present invention is not limited thereto. The third contact portions 272 may be supported by the support spring portions 274 to be movable at least in the up-down direction. In that case, first cover contact points 426 (see FIG. 13) mentioned later are provided not for arm portions 424 (see FIG. 13) but for support basal portions 422 (see FIG. 11).

As shown in FIG. 6, the frame 26 further has a plurality of fixed portions 266. Each of the basal portion 260, the long edge portions 262 and the extending portions 264 is provided with at least one of the fixed portions 266. Moreover, at least one of the fixed portions 266 is arranged between the first contact portions 268 and the third contact portions 272 in the front-rear direction. Similarly, at least another one of the fixed portions 266 is arranged between the second contact portions 270 and the third contact portions 272 in the front-rear direction. The fixed portions 266 are fixed to the substrate (not shown) when the connector 10 is mounted on the substrate.

As shown in FIG. 6, the additional frame 28 is located between the extending portions 264 in the lateral direction. The additional frame 28 is formed of a metal plate and provided with a fixed portion 282 and a spring portion 284. The fixed portion 282 is connected to and fixed on the substrate (not shown) when the connector 10 is mounted on the substrate. As understood from FIG. 5, the spring portion 284 is located in the accommodation portion 30 of the housing 22 at least in part.

As shown in FIGS. 5 and 6, in the present embodiment, the contact rows 60 are two in number. The contact rows 60 are arranged one behind the other. Each of the contact rows 60 consists of a plurality of the contacts 62 arranged in the lateral direction. In the present embodiment, the contacts 62 in each of the contact rows 60 are thirteen in number. However, the present invention is not limited thereto. The number of the contact rows 60 and the number of the contacts 62 in each of the contact rows 60 depend on the number and an arrangement of the card contact points (not shown) of the card 70 (see FIG. 1).

Figure 7:
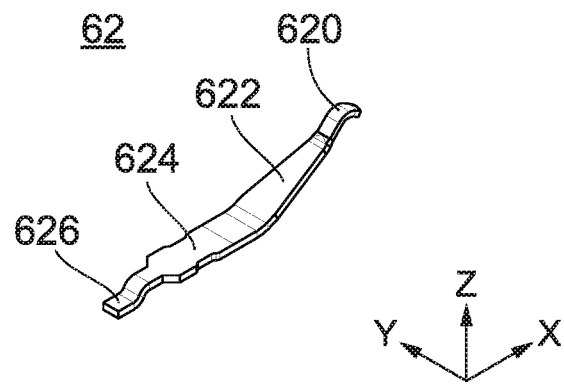
FIG. 7 is a perspective view showing a contact included in the connector body of FIG. 6.

Referring to FIG. 7, each of the contacts 62 is formed of a single metal plate and has a contact point 620, a supporting portion 622, a held portion 624 and a connection portion 626. As understood from FIGS. 5 and 7, the held portion 624 is held by the insulation portion 24. The connection portion 626 is connected to the substrate (not shown) when the connector 10 is mounted on the substrate. The contact point 620 is supported by the supporting portion 622 and located in the accommodation portion 30. The supporting portion 622 has resilience and supports the contact point 620 movably. In the present embodiment, the contact point 620 is movable at least in the up-down direction by using the resilience of the supporting portion 622. When the card 70 (see FIG. 4) is accommodated in the accommodation portion 30, the contact points 620 (see FIG. 5) are pressed downward in the up-down direction by the card contact points (not shown). Simultaneously, the contact points 620 receive upward forces owing to reaction forces of the supporting portions 622 to press the card contact points upward in the up-down direction.

Figure 11:
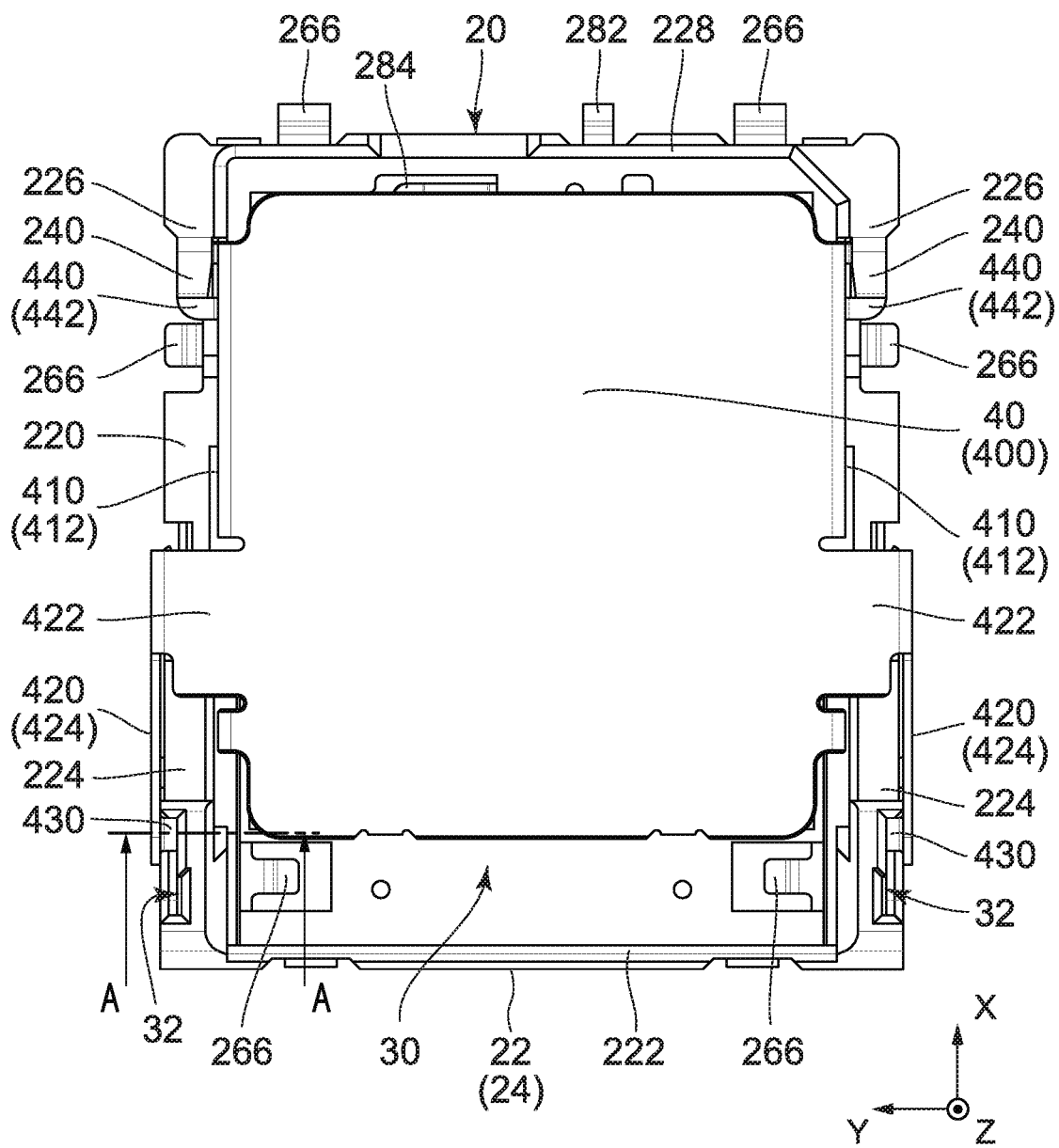
FIG. 11 is a plan view showing the connector of FIG. 9.
Figure 13:
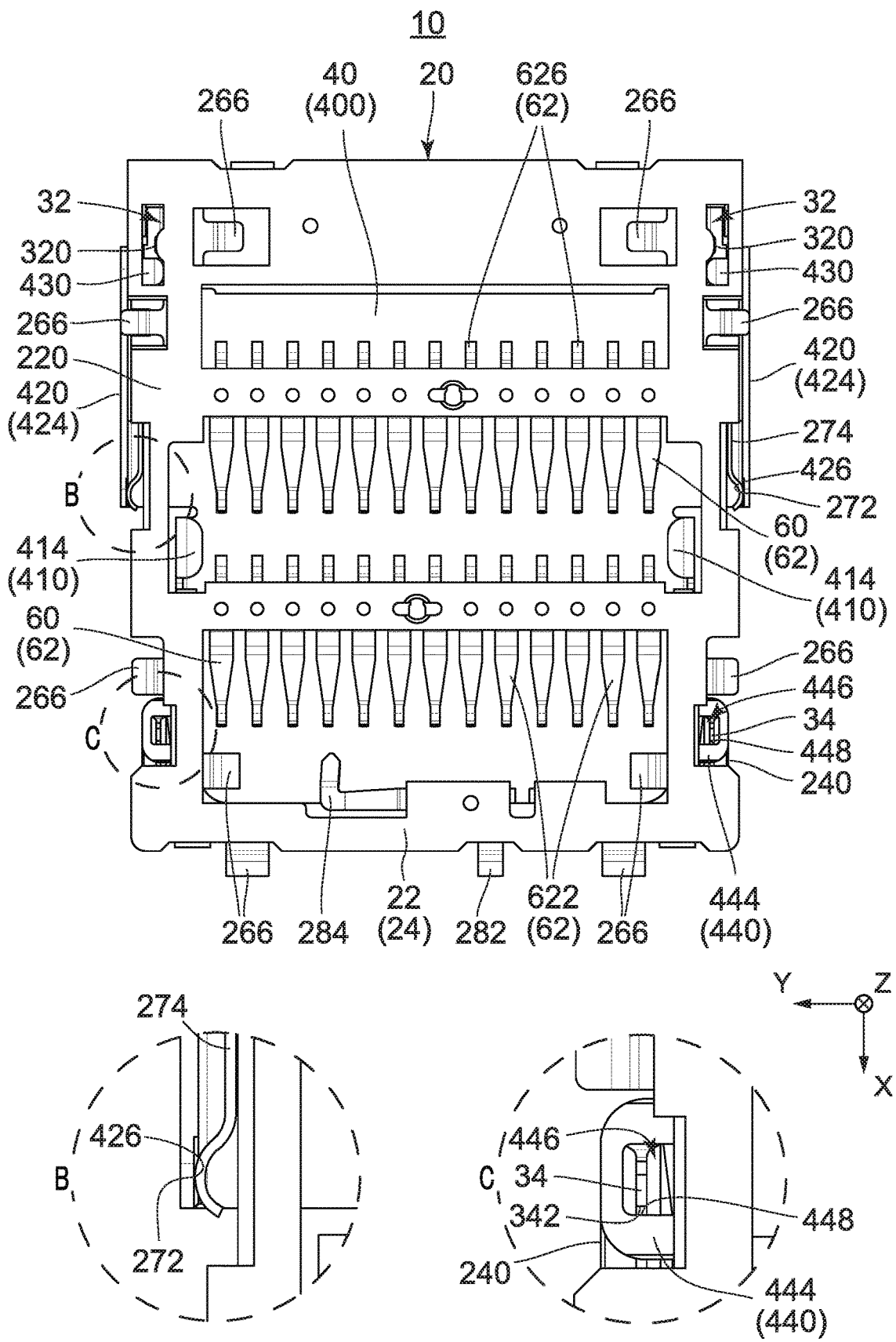
FIG. 13 is a bottom view showing the connector of FIG. 9. A third contact portion of the connector and the vicinity thereof (a part surrounded by a broken line B) and the other lock portion of the connector and the vicinity thereof (a part of surrounded by a broken line C) are enlarged and illustrated.
Figure 14:
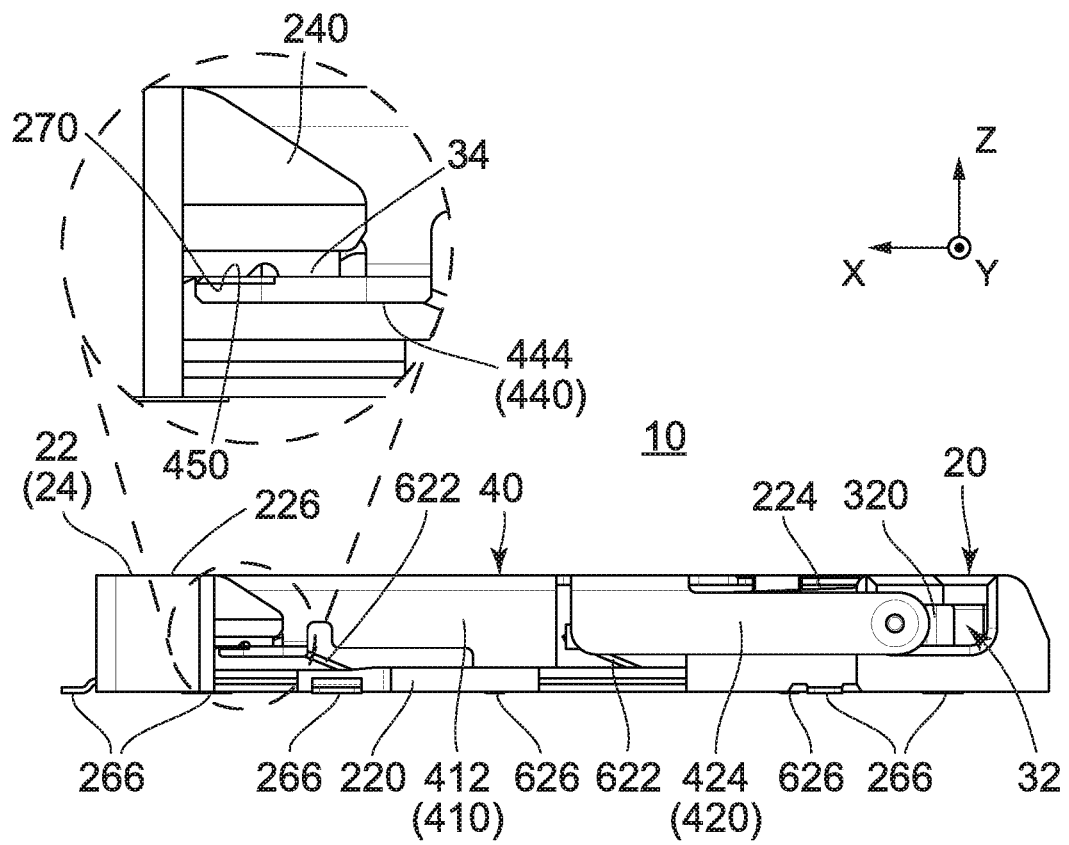
FIG. 14 is a left side view showing the connector of FIG. 9. The lock portion and the vicinity thereof are (a part surrounded by a broken line is) enlarged and illustrated.
Figure 15:
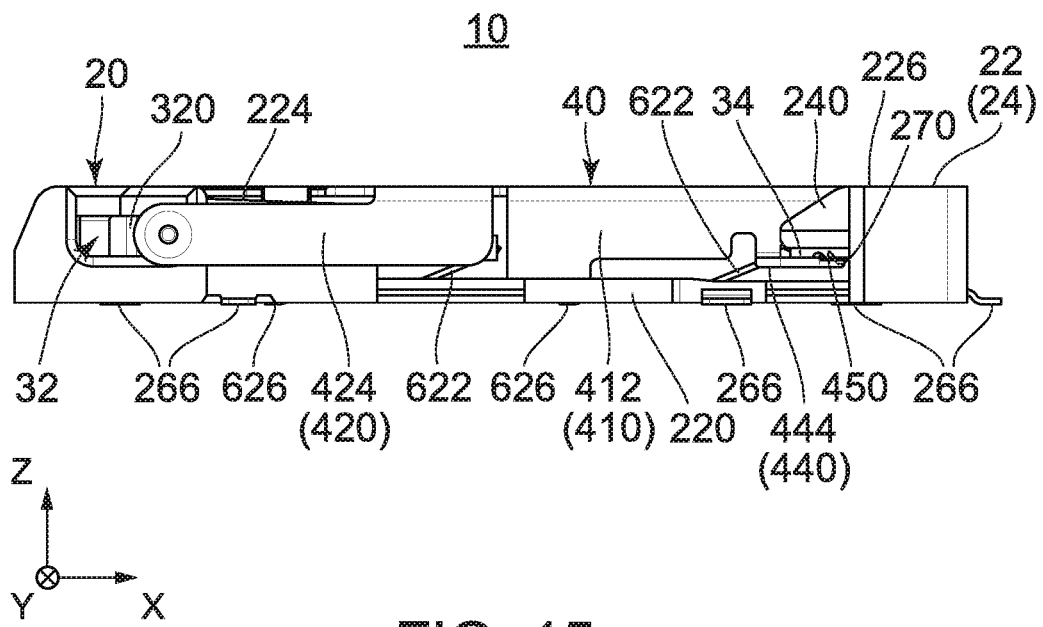
FIG. 15 is a right side view showing the connector of FIG. 9.
Figure 16:
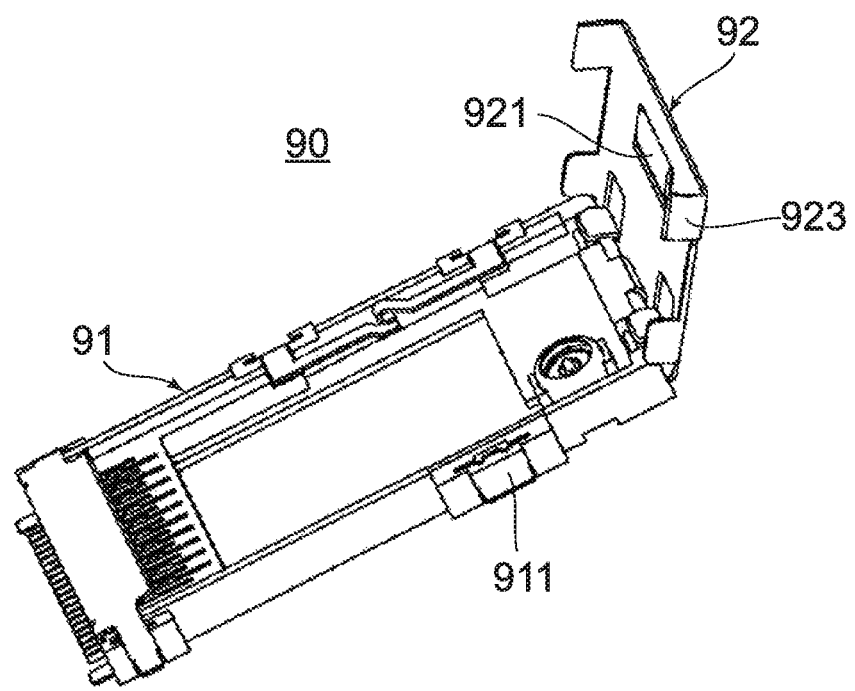
FIG. 16 is a perspective view showing a connector disclosed in Patent Document 1.
Figure 17:
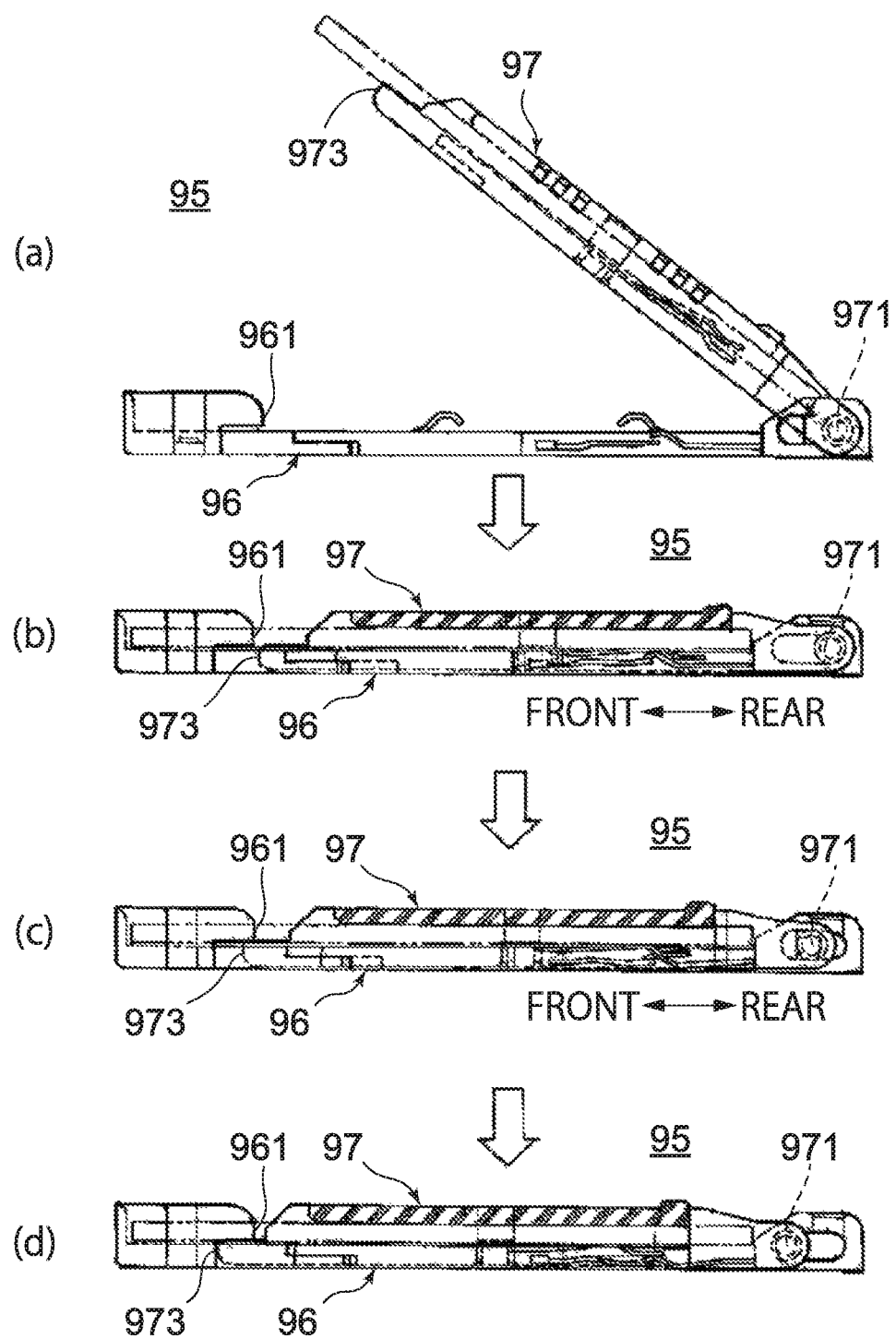
FIG. 17 is a drawing for describing an operation of a cover included in a connector disclosed in Patent Document 2, wherein (a) to (d) show various states of the connector.

As shown in FIGS. 11 and 13, the cover 40 has a main portion 400, two holding portions 410, two axis supporting portions 420, two axis portions 430 and two tabs 440. In the present embodiment, the cover 40 is formed of a single metal plate. As shown in FIGS. 13 to 15, the cover 40 has two of the first cover contact points 426, two locked portions 448 and two second cover contact points 450. The first cover contact points 426 are provided on the axis supporting portions 420, respectively. In the present embodiment, the first cover contact points 426 are parts of the axis supporting portions 420. The locked portions 448 are provided on the tabs 440, respectively. The second cover contact points 450 are also provided on the tabs 440, respectively. In the present embodiment, the locked portions 448 are parts of the tabs 440, and the second cover contact points 450 are other parts of the tabs 440.

As shown in FIG. 11, the main portion 400 has an approximately rectangular plate shape. As understood from FIG. 4, the main portion 400 has about the same size as that of the principal surfaces of the card 70 in the lateral direction. Furthermore, the main portion 400 has a size smaller than that of the principal surfaces of the card 70 in a first direction perpendicular to the lateral direction. In the present embodiment, the first direction coincides with the front-rear direction when the cover 40 is placed at the locked position. The main portion 400 of the cover 40 is positioned on or above an upper part of the housing 22 and covers the accommodation portion 30 when the cover 40 is placed at the locked position. In the present embodiment, an upper surface of the cover 40 coincides with an upper end of the housing 22 in position in the up-down direction.

As shown in FIG. 11 and FIGS. 13 to 15, the holding portions 410 are provided on both sides of the main portion 400 in the lateral direction. Each of the holding portions 410 has a side plate portion 412 and a hook portion 414. The side plate portion 412 extends from the main portion 400 in a second direction perpendicular to both of the first direction and the lateral direction. The second direction coincides with a downward direction in the up-down direction when the cover 40 is placed at the locked position. The hook portion 414 extends inward in the lateral direction from the side plate portion 412. In the present embodiment, the hook portion 414 is positioned at a rear part of the side plate portion 412 when the cover 40 is placed at the locked position. The card 70 (see FIG. 1) is held between the side plate portions 412 and between the main portion 400 and each of the hook portions 414.

As shown in FIGS. 11 to 15, the axis supporting portions 420 are provided on the both sides of the main portion 400 in the lateral direction. The axis supporting portions 420 are positioned rearward of the holding portions 410 in the front-rear direction when the cover 40 is placed at the locked position. Each of the axis supporting portions 420 has the support basal portion 422 and the arm portion 424. The support basal portion 422 extends outward in the lateral direction from the main portion 400. The arm portion 424 extends in the second direction from the support basal portion 422 and further extends along the first direction. When the cover 40 is placed at the closed position or the locked position, a tip of the arm portion 424 is directed rearward in the front-rear direction.

Figure 12:
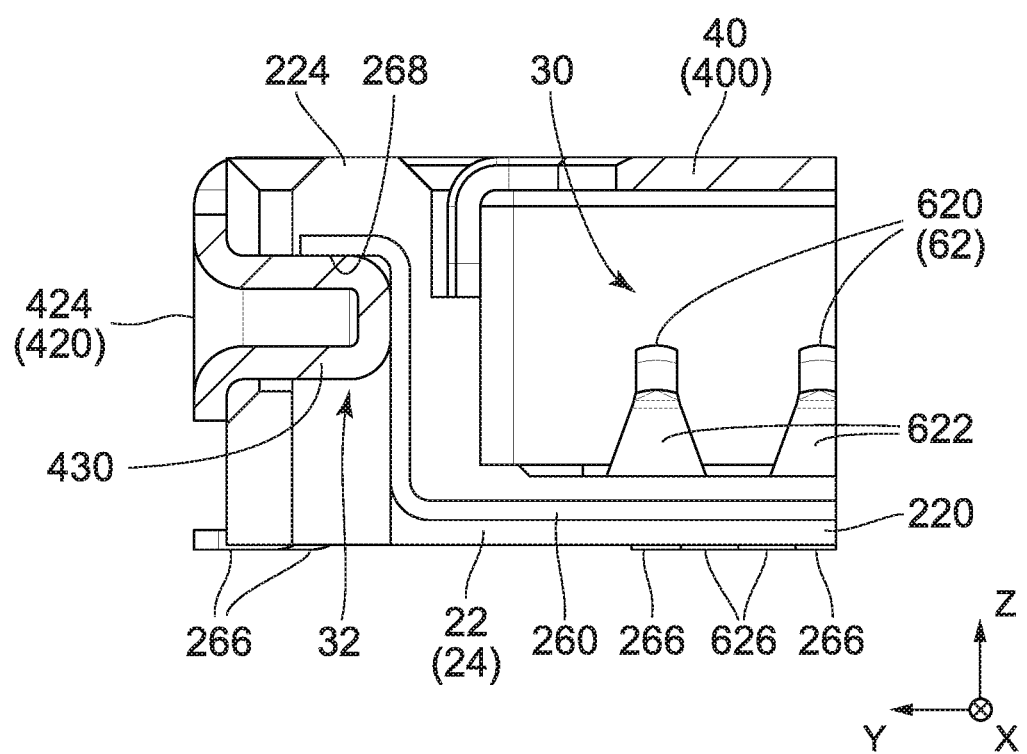
FIG. 12 is a partial cross-sectional view showing a part of the connector of FIG. 11, taken along line A-A.

As shown in FIGS. 11 to 13, the axis portions 430 are provided for tip portions of the axis supporting portions 420, respectively. The axis portions 430 extend inward in the lateral direction from the axis supporting portions 420 to face each other. Moreover, the axis portions 430 are located outward of the main portion 400 in the lateral direction.

As shown in FIGS. 13 to 15, the tabs 440 extend outward in the lateral direction from the side plate portions 412 of the holding portions 410, respectively. Accordingly, the locked portions 448 provided on the tabs 440 and the second cover contact points 450 provided on the tabs 440 are located outward of the main portion 400 in the lateral direction. In the present embodiment, the tabs 440 are positioned on front parts of the side plate portions 412 when the cover 40 is placed at the locked position. Each of the tabs 440 is formed with an aperture portion 446 penetrating from an upper surface 442 (see FIG. 2) thereof to a lower surface 444 thereof in the up-down direction. The aperture portion 446 has a front edge, and the front edge forms the locked portion 448. Moreover, the upper surface 442 of the tab 440 forms the second cover contact point 450 in part.

As understood from FIGS. 1 to 4, the cover 40 is attached to the housing 22 by the use of the axis receiving portions 32. In detail, the axis portions 430 are received by the axis receiving portions 32, respectively, so that the cover 40 is attached to the housing 22. The axis receiving portions 32 allow the axis portions 430 to pivot on an axis extending along the lateral direction which serves as the pivotal axis. With this structure, the cover 40 can pivotally move between the open position (see FIG. 1) and the closed position (see FIG. 3) about the axis portions 430 used as a pivotal axis. Furthermore, the axis receiving portions 32 allow the axis portions 430 to be moved in the front-rear direction. Accordingly, the cover 40 is movable in the front-rear direction between the closed position and the locked position (see FIG. 4). In this way, the cover 40 can be placed at any one of the open position, the closed position and the locked position.

Referring to FIGS. 13 to 15, each of the axis receiving portions 32 is provided with a ridge portion 320 which incompletely divides the axis receiving portion 32 into a front portion and a rear portion. The ridge portion 320 is formed of a part of the insulation portion 24. The ridge portion 320 protrudes outward in the lateral direction and extends in the up-down direction. Furthermore, the ridge portion 320 has two gently inclined or curved surfaces arranged in the front-rear direction. The ridge portions 320 are brought into contact with the axis portions 430 to generate resisting forces when the cover 40 is moved in the front-rear direction. With this structure, the axis portions 430 are prevented from being moved freely in the front-rear direction. On the other hand, the axis supporting portions 420 are resiliently deformable and allow the axis portions 430 to ride over the ridge portions 320. Accordingly, using a force stronger than a predetermined force allows the cover 40 to be moved in the front-rear direction.

As understood from FIGS. 1 and 2, when the cover 40 holding the card 70 is moved from the open position toward the closed position, the card contact points (not shown) of the card 70 are brought into contact with the contact points 620. When the cover 40 is further pressed downward in the up-down direction using a force stronger than a reaction force of the supporting portions 622, the card 70 is brought into contact with the spring portion 284. As understood from FIGS. 2 and 3, when the cover 40 is yet further pressed downward in the up-down direction using a force stronger than both of the reaction force of the supporting portions 622 and a reaction force of the spring portion 284, the card 70 is accommodated in the accommodation portion 30, and the cover 40 arrives at the closed position. For the duration of these, the second contact portions 270 and the third contact portions 272 are never brought into contact with the cover 40. Accordingly, the second contact portions 270 and the third contact portions 272 do not hinder the pivoting of the cover 40.

As shown in FIG. 3, the card 70 held by the cover 40 is accommodated in the accommodation portion 30 when the cover 40 is placed at the closed position. As understood from FIGS. 3 and 4, when the cover 40 is moved forward from the closed position in the front-rear direction, the cover 40 reaches the locked position. Even when the cover 40 reaches the locked position, the card 70 has still stayed in the accommodation portion 30. In other words, the cover 40 is movable with respect to the card 70.

Here, the card 70 (see FIG. 4) accommodated in the accommodation portion 30 receives the reaction force of the contacts 62 (see FIG. 5) and the reaction force of the spring portion 284 (see FIG. 5). Accordingly, the cover 40 placed at the locked position receives an upward force from the card 70 in the up-down direction. The following description is on the assumption that the cover 40 receives the upward force from the card 70.

Figure 9:
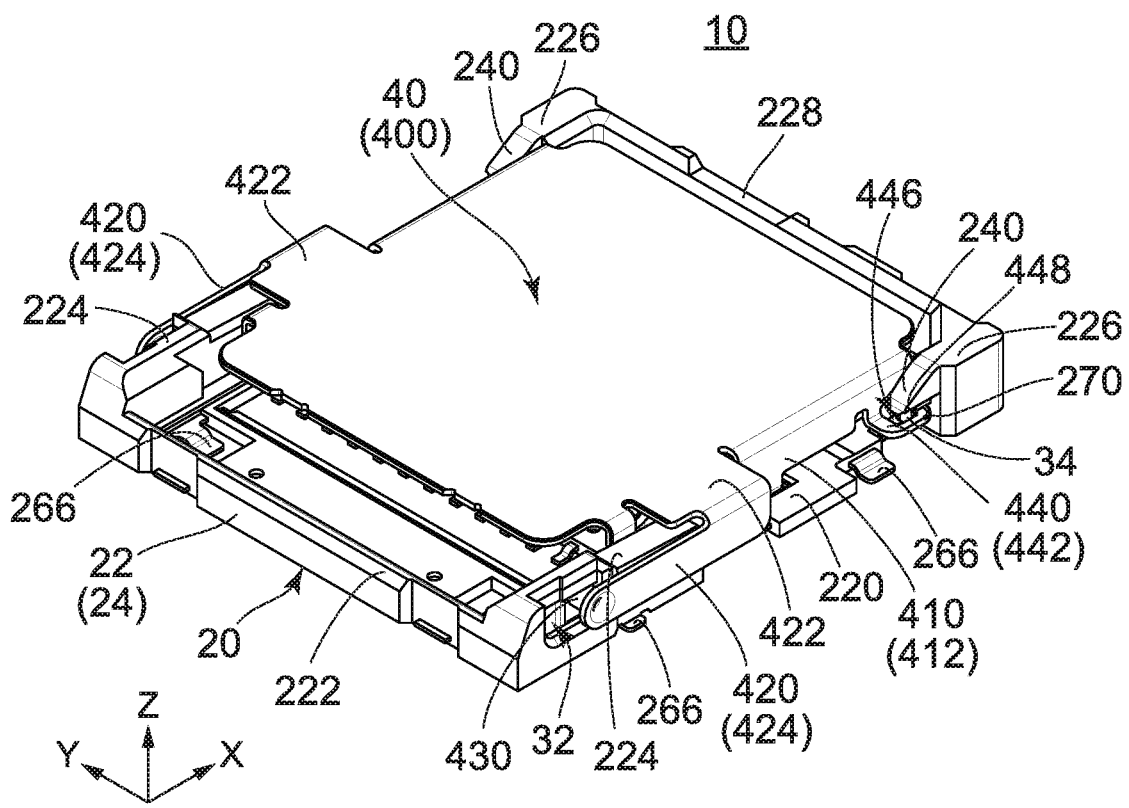
FIG. 9 is another perspective view showing the connector of FIG. 4.
Figure 10:
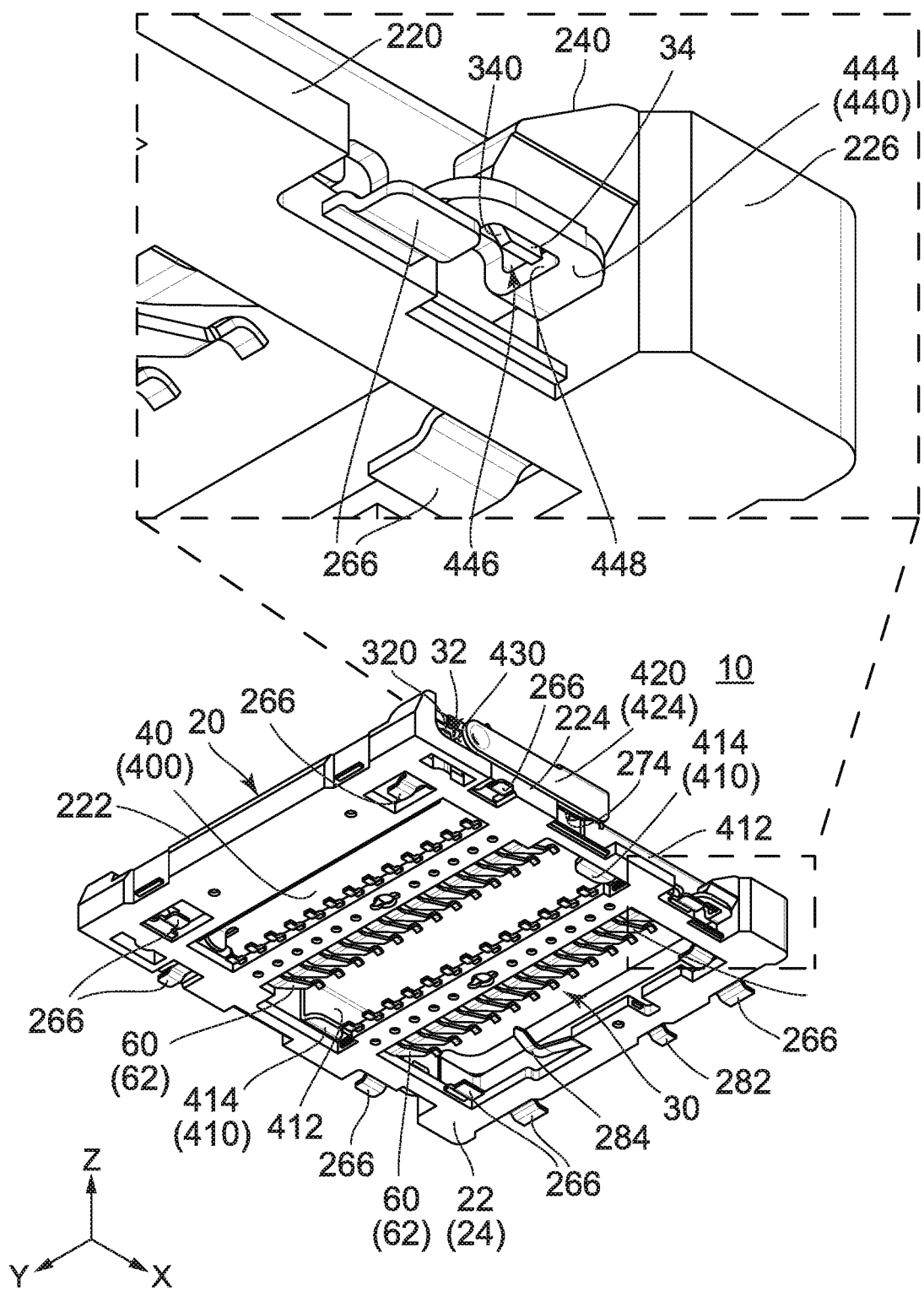
FIG. 10 is a bottom, perspective view showing the connector of FIG. 9. A lock portion of the connector and the vicinity thereof (a part surrounded by a broken line) are enlarged and illustrated.

As shown in FIGS. 9 and 10, when the cover 40 is moved to the locked position, the tabs 440 are moved downward of the overhang portions 240, respectively, in part. As a result, the locked portions 448 are moved downward of the overhang portions 240, respectively, in the up-down direction. At this time, as shown in FIG. 13, the locked portions 448 are positioned forward of the axis portions 430 and the lock portions 34 in the front-rear direction. In order to avoid that the tabs 440 are brought into abutment with the lock portions 34 and thereby the cover 40 cannot be moved to the locked position, rear surfaces 340 of the lock portions 34 are inclined with respect to the front-rear direction as shown in the enlarged view of FIG. 10.

As understood from FIG. 10 and FIGS. 13 to 15, the lock portions 34 are positioned in the aperture portions 446 of the tabs 440, respectively, at least in part when the cover 40 is placed at the locked position. In addition, front surfaces 342 of the lock portions 34 face the locked portions 448, respectively, in the front-rear direction. If a rearward movement of the cover 40 in the front-rear direction is tried, the locked portions 448 are brought into abutment with the lock portions 34, respectively. Thus, the lock portions 34 regulate rearward movements of the locked portions 448 in the front-rear direction. In other words, the lock portions 34 regulate a rearward movement of the cover 40 in the front-rear direction. As a result, the cover 40 cannot be moved from the locked position to the closed position, and the locked state of the connector 10 is maintained.

Figure 8:
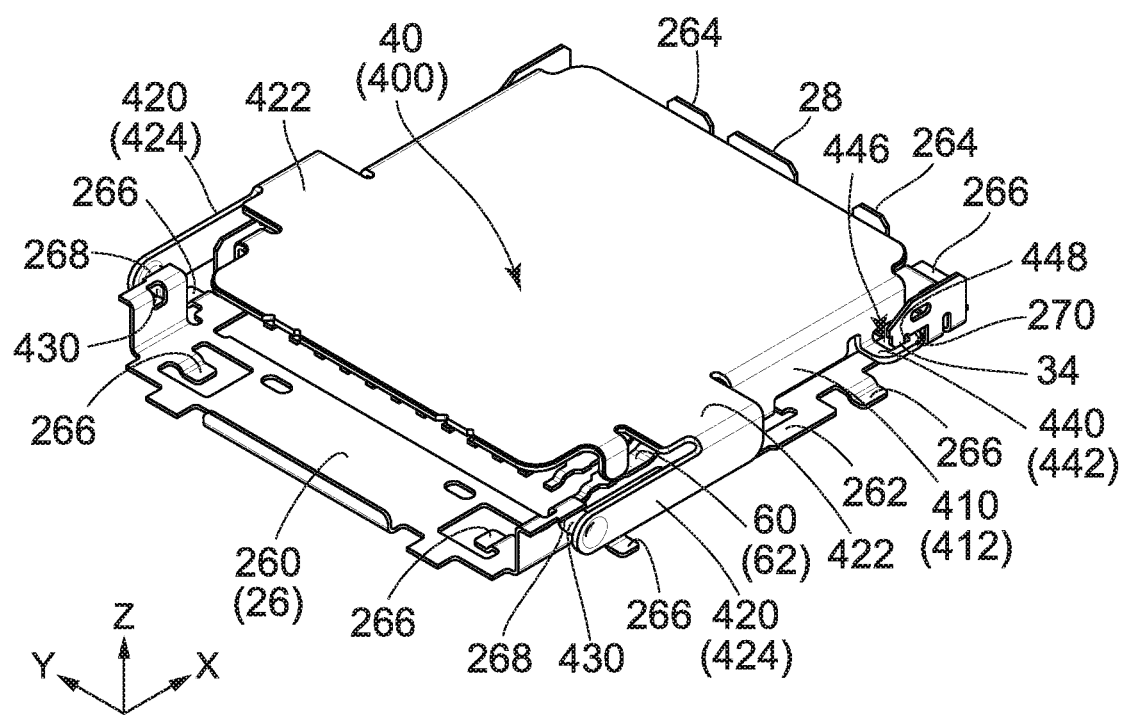
FIG. 8 is a perspective view showing the connector of FIG. 4. The insulation portion is removed.

As understood from FIGS. 8 and 12, the axis portions 430 are positioned under and brought into contact with the first contact portions 268, respectively, when the cover 40 is placed at the locked position. In other words, the axis portions 430 are brought into contact with lower surfaces of the first contact portions 268, respectively, when the cover 40 is placed at the locked position. Moreover, as shown in FIGS. 14 and 15, the second cover contact points 450 are positioned under and brought into contact with the second contact portions 270, respectively, when the cover 40 is placed at the locked position. In other words, the second cover contact points 450 are brought into contact with lower surfaces of the second contact portions 270, respectively, when the cover is placed at the locked position.

As understood from FIGS. 3 and 4, the third contact portions 272 are brought into contact with the arm portions 424 of the cover 40, respectively, when the cover 40 is moved from the closed position to the locked position. As shown in FIG. 13, when the cover 40 is placed at the locked position, the third contact portions 272 are brought into contact with the first cover contact points 426 provided for the arm portions 424, respectively. In this way, the first cover contact points 426 are not brought into contact with the third contact portions 272 when the cover 40 is placed at the closed position, whereas the first cover contact points 426 are brought into contact with the third contact portions 272 when the cover 40 is placed at the locked position.

As mentioned above, the first contact portions 268, the second contact portions 270 and the third contact portions 272 provided for the frame 26 are brought into contact with the axis portions 430, the second cover contact points 450 and the first cover contact points 426 of the cover 40, respectively (see FIGS. 8, 13 and 14). With this structure, heat generated in the card 70 (see FIG. 4) and conducted to the cover 40 reaches the frame 26 through three types of paths, i.e., paths from the axis portions 430 to the first contact portions 268 of the frame 26, paths from the second cover contact points 450 to the second contact portions 270 of the frame 26, and paths from the first cover contact points 426 to the third contact portions 272 of the frame 26. The heat, which is conducted from the cover 40 to the frame 26 as just described, is further conducted to the substrate (not shown) via the fixed portions 266 (see FIG. 6).

As understood from the above paragraph, the connector 10 according to the present embodiment uses the axis portions 430 and the tabs 440 as thermal conduction paths between the frame 26 and the cover 40. In addition to this, the connector 10 is provided with other thermal conduction paths other than the thermal conduction paths mentioned above. In detail, the other thermal conduction paths are formed by using the third contact portions 272 in the present embodiment. Therefore, the connector 10 can efficiently conduct the heat generated in the card 70 to the substrate. In addition, the third contact portions 272 hardly affect the open and close operation of the cover 40. Moreover, since the frame 26 is formed of the single-piece member, the heat from the cover 40 can be distributed and conducted to the substrate. Furthermore, all of the thermal conduction paths to the substrate can be effectively used even if contact failure is occurred in any one of the thermal conduction paths between the frame 26 and the cover 40.

The description mentioned above is on the assumption that the cover 40 placed at the locked position receives the upward force via the card 70. However, the card 70 is not a component of the present invention. In the absence of the card 70, the cover 40 might be positioned at a position slightly lower than the aforementioned position in the up-down direction when the cover 40 is placed at the locked position. In that case, the axis portions 430 of the cover 40 may be positioned downward of the first contact portions 268 and face the first contact portions 268 in the up-down direction when the cover 40 is placed at the locked position. Moreover, the second cover contact points 450 may be positioned downward of the second contact portions 270 and face the second contact portions 270 in the up-down direction. Here, the lock portions 34 may be or not be inserted into the aperture portions 446 of the tabs 440 in part.

Although the specific explanation about the present invention is made above referring to the embodiments, the present invention is not limited thereto but susceptible of various modifications and alternative forms without departing from the spirit of the invention. For example, although the support spring portions 274 supporting the third contact portions 272 extend forward in the embodiment mentioned above, they may be formed to extend in another direction. Specifically, the support spring portions 274 may be formed extend rearward, upward, backward-diagonally upward, or frontward-diagonally upward. Nevertheless, considering possibility that the support spring portions 274 are brought into abutment with the cover 40 to be buckled, it is preferable that the support spring portions 274 extend forward.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A connector which is mountable on a substrate, wherein:
   the connector comprises a cover, a housing and a plurality of contact rows;
   the housing has an accommodation portion which accommodates a card having a plurality of card contact points;
   the housing is provided with two axis receiving portions and two lock portions;
   the lock portions are located forward of the axis receiving portions in a front-rear direction;
   the axis receiving portions are located apart from each other in a lateral direction perpendicular to the front-rear direction;
   the lock portions are located apart from each other in the lateral direction;
   the housing comprises an insulation portion and a frame;
   the insulation portion holds the contact rows;
   the insulation portion further holds the frame while the frame is exposed in part;
   the frame comprises a single-piece member made of metal and has a plurality of fixed portions, two first contact portions, two second contact portions, a plurality of third contact portions and a plurality of support spring portions;
   the first contact portions correspond to the axis receiving portions, respectively;
   each of the first contact portions is exposed in the axis receiving portion corresponding thereto;
   the second contact portions correspond to the lock portions, respectively;
   the support spring portions have resilience and are located between the first contact portions and the second contact portions in the front-rear direction;
   the third contact portions are supported by the support spring portions, respectively;
   the third contact portions are movable at least in a direction perpendicular to the front-rear direction by using the resilience of the support spring portions;
   the fixed portions are fixed to the substrate when the connector is mounted on the substrate;
   at least one of the fixed portions is arranged between the first contact portions and the third contact portions in the front-rear direction;
   at least another one of the fixed portions is arranged between the second contact portions and the third contact portions in the front-rear direction;

each of the contact rows is formed of a plurality of contacts which are arranged in the lateral direction;

each of the contacts has a contact point and a supporting portion;

the contact point is located in the accommodation portion;

the supporting portion has resilience and supports the contact point;

by using the resilience of the supporting portion, the contact point is movable at least in an up-down direction perpendicular to both of the front-rear direction and the lateral direction;

when the card is accommodated in the accommodation portion, the contact point is pressed downward in the up-down direction by one of the card contact points and receives an upward force given by a reaction force of the supporting portion;

the cover is made of metal and has a main portion, two axis portions, two first cover contact points, two locked portions and two second cover contact points;

the axis portions are located outward of the main portion in the lateral direction;

the axis portions are received by the axis receiving portions, respectively, so that the cover is attached to the housing so as to be positioned at any one of an open position, a closed position and a locked position;

the cover is pivotally movable between the open position and the closed position about the axis portions used as a pivotal axis;

the cover is movable between the closed position and the locked position in the front-rear direction;

when the cover is placed at the locked position, the main portion of the cover is positioned on or above an upper part of the housing and covers the accommodation portion;

when the cover is placed at the locked position, the axis portions are positioned downward of the first contact portions and face the first contact portions in the up-down direction, respectively;

the locked portions are positioned outward of the main portion in the lateral direction;

when the cover is placed at the locked position, the locked portions are positioned forward of the axis portions in the front-rear direction;

the second cover contact points are positioned outward of the main portion in the lateral direction;

when the cover is placed at the locked position, the second cover contact points are positioned downward of the second contact portions and face the second contact portions in the up-down direction, respectively;

when the cover is placed at the closed position, the first cover contact points are not brought into contact with the third contact portions; and when the cover is placed at the locked position, the first cover contact points are brought into contact with the third contact portions, respectively.

2. The connector as recited in claim 1, wherein:

when the card is accommodated in the accommodation portion and the cover is placed at the locked position, the locked portions are regulated by the lock portion not to be moved rearward in the front-rear direction; and when the card is accommodated in the accommodation portion and the cover is placed at the locked position, the axis portions are brought into contact with the first contact portions, respectively, and the second cover contact points are brought into contact with the second contact portions, respectively.

3. The connector as recited in claim 1, wherein when viewed along the up-down direction, the frame forms at least three sides of the accommodation portion.

4. The connector as recited in claim 1, wherein the third contact portions are movable at least in the lateral direction.

5. The connector as recited in claim 1, wherein by moving the cover placed at the closed position forward in the front-rear direction, the cover is shifted into the locked position.

6. The connector as recited in claim 1, wherein:

the housing has two overhang portions overhanging rearward in the front-rear direction;

the lock portions are provided for the overhang portions, respectively; and when the cover is moved from the closed position to the locked position, the locked portions are moved downward of the overhang portions in the up-down direction.

7. The connector as recited in claim 6, wherein:

the lock portions protrude downward from the overhang portions in the up-down direction, respectively;

the second contact portions protrude downward from the overhang portions in the up-down direction, respectively;

the cover is provided with two tabs;

each of the tabs is provided with an aperture portion;

each of the locked portions is formed of an edge of the aperture portion; and the second cover contact points are formed on upper surfaces of the tabs, respectively.

* * * * *